(12) United States Patent
Christ

(10) Patent No.: US 7,432,839 B2
(45) Date of Patent: Oct. 7, 2008

(54) ADC WITH LOGARITHMIC RESPONSE AND METHODS FOR CONTROLLING RF POWER LEVELS

(75) Inventor: Volker Christ, Neuss (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 11/679,615

(22) Filed: Feb. 27, 2007

(65) Prior Publication Data

US 2008/0204299 A1 Aug. 28, 2008

(51) Int. Cl.
*H03M 1/62* (2006.01)
*H03M 1/84* (2006.01)

(52) U.S. Cl. ...................... 341/138; 341/145

(58) Field of Classification Search ............... 341/139, 341/138, 144, 155
See application file for complete search history.

(56) References Cited

U.S. PATENT DOCUMENTS

| 3,997,892 | A | * | 12/1976 | Susset ........................ 341/136 |
| 4,160,244 | A | * | 7/1979 | Solomon et al. ............. 341/148 |
| 5,334,979 | A | * | 8/1994 | Hatakeyama ................ 341/138 |
| 5,389,927 | A | * | 2/1995 | Turney et al. ............... 341/139 |
| 5,519,396 | A | * | 5/1996 | Distinti ....................... 341/153 |
| 6,965,407 | B2 | * | 11/2005 | Boemler et al. ............. 348/302 |

* cited by examiner

*Primary Examiner*—Peguy JeanPierre
(74) *Attorney, Agent, or Firm*—Schwegman, Lundberg & Woessner, P.A.

(57) ABSTRACT

Embodiments of an analog-to-digital converter (ADC) and methods for controlling RF power levels are generally described herein. Other embodiments may be described and claimed. In some embodiments, the ADC includes an internal-reference digital-to-analog converter (DAC) having a resistive structure with linearly-spaced contact nodes. The linearly-spaced contact nodes may provide corresponding reference voltages that vary exponentially with respect to the linearly-spaced contact nodes allowing the ADC to achieve a logarithmic response.

7 Claims, 5 Drawing Sheets

ADC WITH LOGARITHMIC RESPONSE CHARACTERISTIC

SCHEMATIC REPRESENTATION OF RESISTIVE ELEMENT

EXAMPLE LAYOUT OF RESISTIVE ELEMENT

TRANSMITTER

DAC WITH SELECTIVE RESPONSE

ADC WITH LOGARITHMIC RESPONSE AND METHODS FOR CONTROLLING RF POWER LEVELS

TECHNICAL FIELD

Some embodiments pertain to electronic circuits. Some embodiments pertain to analog-to-digital converters (ADCs). Some embodiments pertain to radio-frequency (RF) transmitters.

BACKGROUND

In RF devices, digital representations of RF signal levels and/or measured field strengths are used by digital circuitry. Because RF signal levels are generally measured in decibels (dB), which are logarithmic representations of the RF power level, linear ADCs that convert voltages representing the RF signal levels do not provide the desired precision at lower levels. ADCs with a logarithmic response may be used to overcome this issue, but are difficult and/or expensive to fabricate. Alternatively, the output of linear ADCs may be converted digitally to a logarithmic output, but linear ADCs may not have the precision in the lower range to provide an accurate result.

Thus, there are general needs for ADCs having a non-linear response, and methods for converting an input voltage to a digital output. There are also general needs for ADCs having a non-linear response that provide more precision at the lower range, that are less expensive and/or that require less precision to fabricate. There are also general needs for ADCs having a non-linear response suitable for converting analog signals representing RF signal levels to digital signals to more accurately represent the dB level.

DETAILED DESCRIPTION

The following description and the drawings sufficiently illustrate specific embodiments of the invention to enable those skilled in the art to practice them. Other embodiments may incorporate structural, logical, electrical, process, and other changes. Examples merely typify possible variations. Individual components and functions are optional unless explicitly required, and the sequence of operations may vary. Portions and features of some embodiments may be included in, or substituted for those of other embodiments. Embodiments of the invention set forth in the claims encompass all available equivalents of those claims. Embodiments of the invention may be referred to herein, individually or collectively, by the term "invention" merely for convenience and without intending to limit the scope of this application to any single invention or inventive concept if more than one is in fact disclosed.

Figure 1:
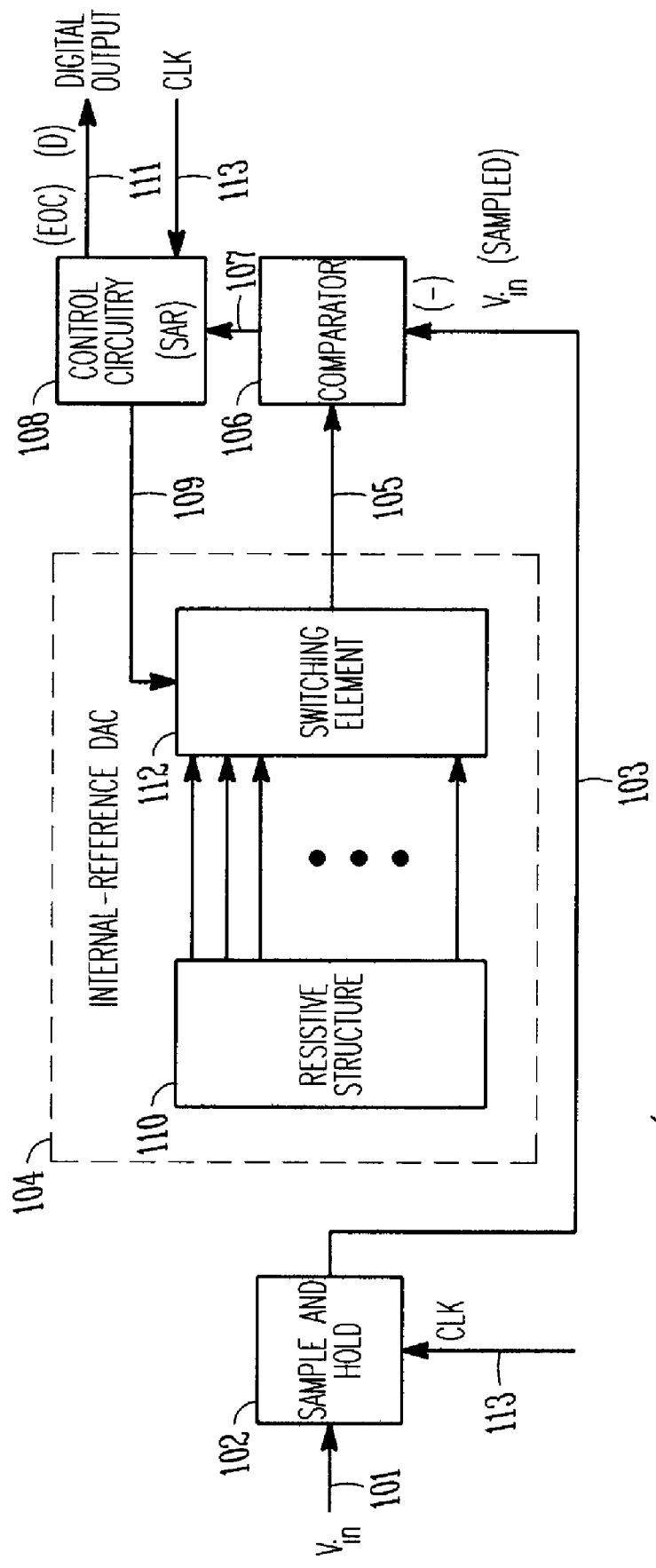
FIG. 1 is a block diagram of a successive-approximation ADC in accordance with some embodiments of the present invention.

FIG. 1 is a block diagram of a successive-approximation ADC in accordance with some embodiments of the present invention. Successive-approximation ADC 100 may comprise sample and hold circuitry 102 to acquire input voltage 101 ($V_{in}$) and provide sampled input voltage 103, and internal-reference DAC 104 to provide analog output 105 based on digital control signal 109. Successive-approximation ADC 100 may also include comparator 106 to compare analog output 105 of internal-reference DAC 104 with sampled input voltage 103, and control circuitry 108 to generate digital output signals 111 based on output 107 of comparator 106.

In accordance with some embodiments of the present invention, internal-reference DAC 104 may include resistive structure 110 having a plurality of linearly-spaced contact nodes. In some embodiments, the linearly-spaced contact nodes may be fabricated to provide corresponding reference voltages that vary non-linearly. In some embodiments, the linearly-spaced contact nodes may be fabricated to provide corresponding reference voltages that vary exponentially. Internal-reference DAC 104 may also include switching element 112 to selectively couple one of the contact nodes to analog output 105 based on digital control signal 109. In these embodiments, control circuitry 108 may generate digital output signals 111 based on a comparison between output 105 of a selected one of the contact nodes and sampled input voltage 103.

In accordance with some embodiments, control circuitry 108 may be responsive to output 107 of comparator 106 to provide digital control signal 109. Digital control signal 109 may successively instruct switching element 112 to selectively couple one of the contact nodes to analog output 105 until the voltage level of analog output 105 approximates sampled input voltage 103. In some embodiments, control circuitry 108 may generate digital output signals 111, which may digitally represent sampled input voltage 103 based on digital control signal 109 when comparator 106 indicates that the voltage level of analog output 105 approximates sampled input voltage 103.

In these embodiments, because the corresponding reference voltages of the contact nodes may vary exponentially, the response of internal-reference DAC 104 may vary exponentially. Furthermore, the response of successive-approximation ADC 100 may vary logarithmically because the response of internal-reference DAC 104 may vary exponentially. In some embodiments, resistive structure 110 may be coupled to a stabilized reference voltage to provide the corresponding reference voltages at the linearly-spaced contact nodes. In these embodiments, the layout of resistive structure 110 may be selected to provide a voltage response at the linearly-spaced contact nodes to have an exponential profile. These embodiments are discussed in more detail below.

Unlike some conventional ADCs that provide a logarithmic response, contact nodes with an exponential spacing are not required.

In some other embodiments, the corresponding reference voltages of the contact nodes may vary in a non-linear fashion other than exponentially and accordingly, the response of internal-reference DAC 104 may vary in the non-linear fashion other than exponentially. In these embodiments, the response of successive-approximation ADC 100 may vary in a non-linear fashion other than logarithmically because the response of internal-reference DAC 104 may vary non-linearly, although the scope of the invention is not limited in this respect.

Figure 2A:
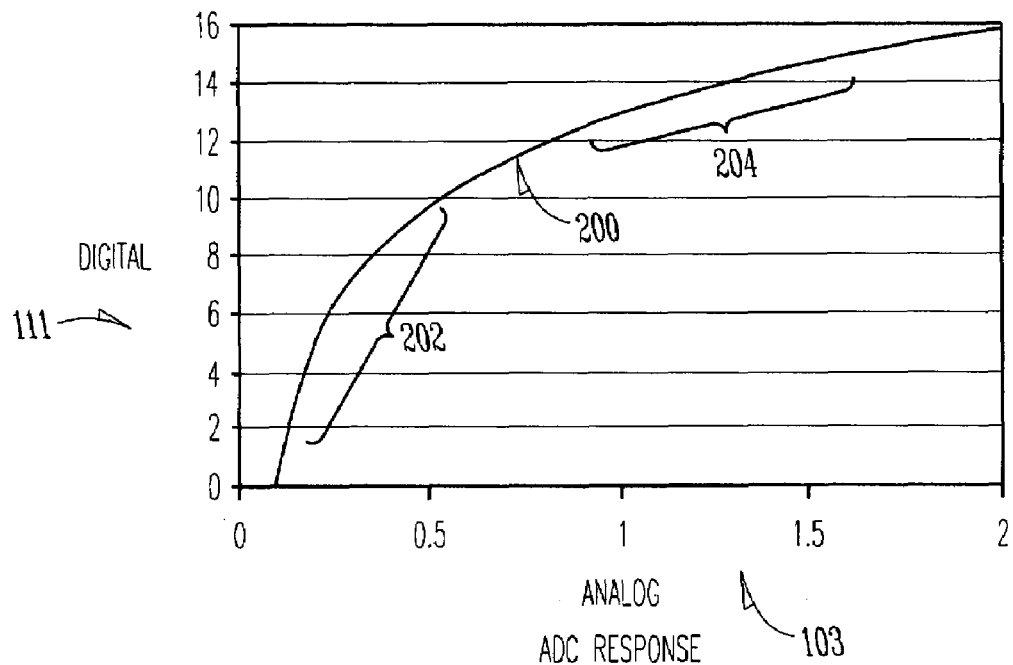
FIG. 2A illustrates a logarithmic response of a successive-approximation ADC in accordance with some embodiments of the present invention.

FIG. 2A illustrates a logarithmic response of a successive-approximation ADC in accordance with some embodiments of the present invention. In FIG. 2A, sampled input voltage 103 is converted to digital output signals 111 in accordance with a logarithmic response curve 200. Increased sensitivity may be provided for lower input signal levels (e.g., region 202) while reduced sensitivity may be provided for higher input signal levels (e.g., region 204). These embodiments are discussed in more detail below.

Figure 2B:
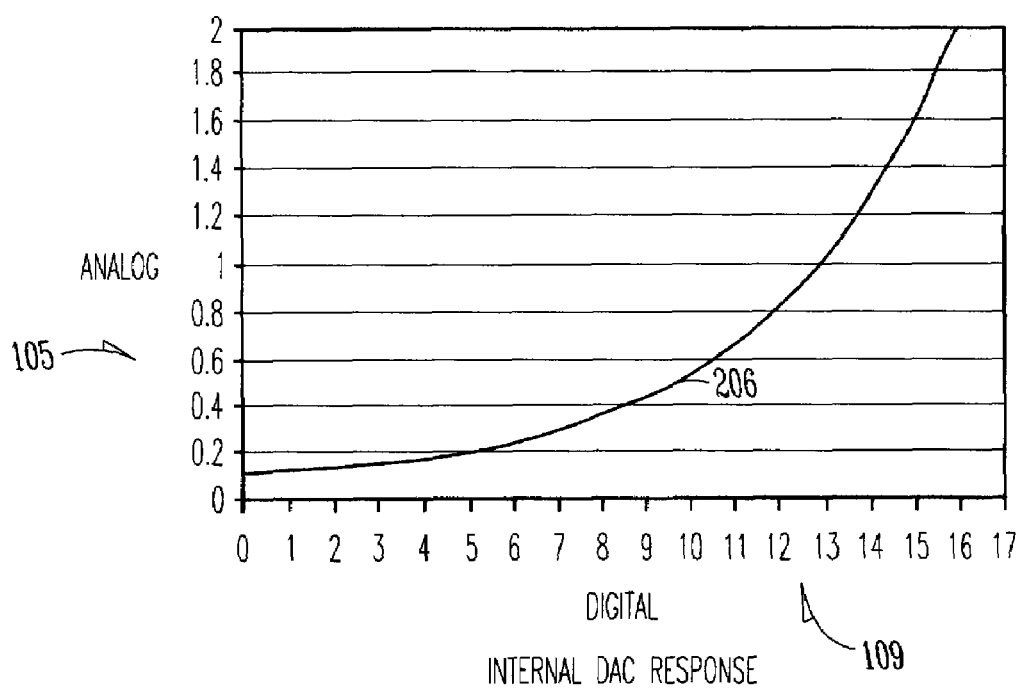
FIG. 2B illustrates an exponential response of an internal-reference digital-to-analog converter (DAC) of a successive-approximation ADC in accordance with some embodiments of the present invention.

FIG. 2B illustrates an exponential response of an internal-reference DAC of a successive-approximation ADC in accordance with some embodiments of the present invention. Exponential response 206 may illustrate an example of a non-linear response of internal-reference DAC 104 (FIG. 1). As illustrated in FIG. 2B, analog output 105 is an exponential function of digital control signal 109. The operations of internal-reference DAC 104 (FIG. 1) to achieve exponential response 206 are discussed in more detail below.

Referring to FIGS. 1, 2A and 2B, the logarithmic response of successive-approximation ADC 100 may be suitable for use in RF power level applications. RF power levels are generally provided in the form of decibels (dB), which are logarithmic representations of the RF power level. Accordingly, the use of successive-approximation ADC 100 in RF power level applications may provide increased sensitivity for lower power levels (e.g., region 202 of curve 200) and reduced sensitivity for higher power levels (e.g., region 204 of curve 200).

Although successive-approximation ADC 100 is illustrated as having several separate functional elements, one or more of the functional elements may be combined and may be implemented by combinations of software-configured elements, such as processing elements including digital signal processors (DSPs), and/or other hardware elements. For example, some elements may comprise one or more microprocessors, DSPs, application specific integrated circuits (ASICs), and combinations of various hardware and logic circuitry for performing at least the functions described herein. In some embodiments, the functional elements of successive-approximation ADC 100 may refer to one or more processes operating on one or more processing elements.

In some embodiments, control circuitry 108 may include a successive-approximation register (SAR). In these embodiments, control circuitry 108 may supply digital control signal 109. Digital control signal 109 may comprise an approximate digital code to internal-reference DAC 104. Internal-reference DAC 104 may provide comparator 106 with analog output 105, which may be an analog voltage equivalent of the digital code for comparison with sampled input voltage 103. In some embodiments, the SAR may be initialized so that the most significant bit (MSB) is equal to a digital 1. The code may be fed into internal-reference DAC 104 which may then supply the analog equivalent of this digital code to comparator 106 for comparison with sampled input voltage 103. When analog output 105 exceeds sampled input voltage 103, output 107 of comparator 106 may cause the SAR to reset the current bit and may set the next bit to a digital 1. When analog output 105 is less than sampled input voltage 103, the bit may remain a 1 and the next bit may be set to 1. This binary search process may continue until every bit in the SAR has been tested. The resulting code is a digital approximation of sampled input voltage 103 and is finally output by successive-approximation ADC 100 at the end of the conversion (EOC) as digital output signal 111. In some embodiments, one bit of digital output signal 111 may be determined for each clock cycle using clock signal 113. One or more prior clock cycles may also be utilized to sample and hold input voltage 101 to generate sampled input voltage 103, although the scope of the invention is not limited in this respect.

Figure 3A:
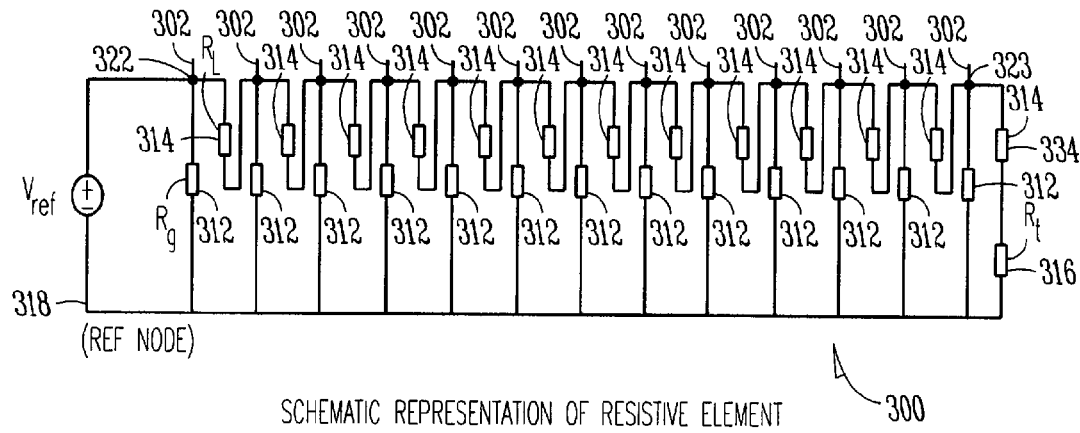
FIG. 3A is a schematic representation of a resistive structure in accordance with some embodiments of the present invention.

FIG. 3A illustrates a schematic representation of a resistive structure in accordance with some embodiments of the present invention. Resistive structure 300 may be a schematic or functional representation of resistive structure 110 (FIG. 1). In these embodiments, resistive structure 300 may include a plurality of contact nodes 302, a plurality of ladder-resistive elements 314 ($R_L$), a plurality of ground-resistive elements 312 ($R_G$), and termination-resistive element 316 ($R_T$). In some embodiments, the plurality of ladder-resistive elements 314 may be arranged in series in which one of contact nodes 302 may be provided between each of series-coupled ladder-resistive elements 314. Each ground-resistive element 312 may couple one contact node 302 to reference node 318, and termination-resistive element 316 may couple final ladder-resistive element 334 to reference node 318. In some embodiments, stabilized reference voltage 320 ($V_{ref}$) may be provided across the reference node 318 and initial contact node 322. In some embodiments, reference node 318 may be coupled to either ground or a $V_{ss}$.

In these embodiments, as current flows through the resistive structure 300 from stabilized reference voltage 320 to reference node 318, the voltage produced at each of contact nodes 302 may vary in a substantially exponential fashion as illustrated in FIG. 2B. The selection of ground-resistive elements 312, termination-resistive element 316, and ladder-resistive elements 314 to provide a substantially exponential response is discussed in more detail below.

In some embodiments, the ladder-resistive elements 314, ground-resistive elements 312, and termination-resistive element 316 comprise a resistive material, such as polycrystalline silicon (i.e., poly-silicon), disposed on a semiconductor substrate. These embodiments are discussed in more detail below.

Figure 3B:
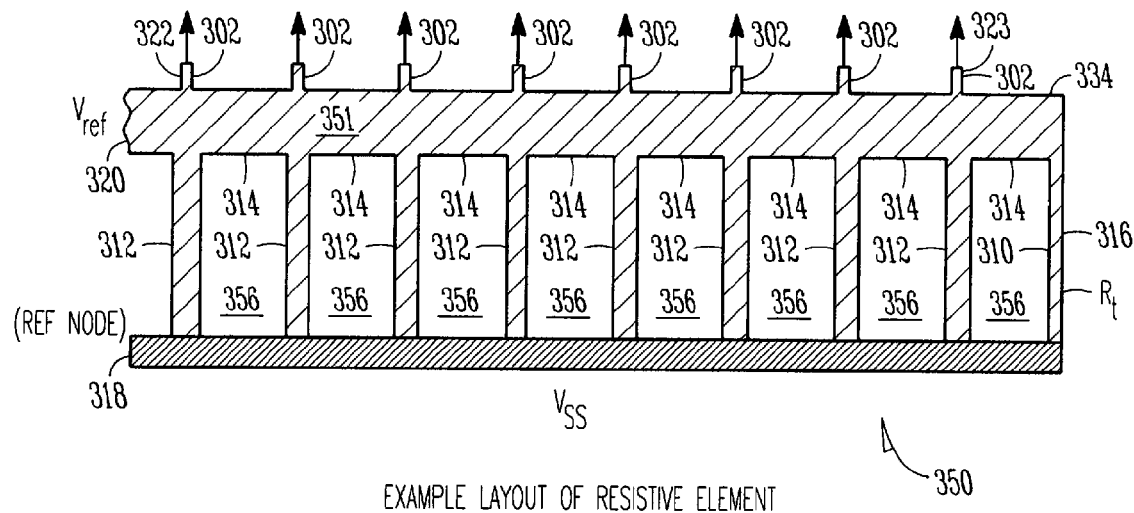
FIG. 3B is a layout representation of a resistive structure in accordance with some embodiments of the present invention.

FIG. 3B illustrates a layout representation of a resistive structure in accordance with some embodiments of the present invention. Resistive structure 350 illustrated in FIG. 3B may be suitable for use as resistive structure 300 (FIG. 3A) and/or resistive structure 110 (FIG. 1), although other layout configurations may also be suitable. In these embodiments, resistive structure 300 comprises resistive semiconductor material 351 disposed on a semiconductor substrate (e.g., a semiconductor die) in a comb-like configuration as shown. In these embodiments, contact nodes 302 may be provided with a constant (i.e., linear) spacing therebetween along a first strip of resistive semiconductor material 351 to define ladder-resistive elements 314. Ground-resistive elements 312 may comprise second strips of resistive semiconductor material 351 coupling the first strip to reference node 318. As illustrated, ground-resistive elements 312 may be regularly spaced and parallel to each other, although the scope of the invention is not limited in this respect. Termination-resistive element 316 may comprise a third strip of resistive semiconductor material 351 coupling final ladder-resistive element 334 to reference node 318. In these embodiments, regions 356 between ground-resistive elements 312 may be devoid of resistive semiconductor material 351, although the scope of the invention is not limited in this respect.

In the embodiments illustrated in FIG. 3B, ladder-resistive elements 314 may correspond to ladder-resistive elements 314 (FIG. 3A), ground-resistive elements 312 may correspond to ground-resistive elements 312 (FIG. 3A), and termination-resistive element 316 may correspond to termination-resistive element 316 (FIG. 3A), although the scope of the invention is not limited in this respect.

In some embodiments, ground-resistive elements 312, ladder-resistive elements 314, and termination-resistive element 316 may be selected to provide a substantially exponential relation between voltages present at successive contact nodes 302. In these embodiments, the voltage between contact nodes 302 changes exponentially from a first value at initial contact node 322 to a second voltage value at final contact node 323. In some embodiments, the first voltage value may be closer to the value of stabilized reference voltage 320, and the second voltage value may be closer to the voltage at reference node 318 (e.g., $V_{ss}$ or ground), although the scope of the invention is not limited in this respect. The generation of the exponential relation is discussed in more detail below. In some alternate embodiments, the values of ground-resistive elements 312, ladder-resistive elements 314, and termination-resistive element 316 may be selected to provide a non-linear relation between voltages present at successive contact nodes 302.

In some embodiments, resistive semiconductor material 351 may comprise polycrystalline silicon, although the scope of the invention is not limited in this respect. In these embodiments, the polycrystalline silicon may be fabricated using a complementary metal oxide semiconductor (CMOS) process without a low-ohmic implant to provide increased resistivity. In these embodiments, the polycrystalline silicon may be deposited using a blocking mask to prevent the implant from being processed over the poly-silicon resistive material. In some embodiments, contact nodes 302 may comprise metallic contacts fabricated during the CMOS process.

In some alternate embodiments, resistive semiconductor material 351 may comprise a diffusion area or a metallic resistive material, although the scope of the invention is not limited in this respect. In some embodiments, resistive semiconductor material 351 and contact nodes 302 may be fabricated using any type of processing technique including a metal-oxide semiconductor (MOS) type process although, the scope of the invention is not limited in this respect.

In some embodiments, contact nodes 302 may be linearly-positioned taps. In some embodiments, the corresponding reference voltages at the linearly-spaced contact nodes 302 may vary exponentially in accordance with the following expression:

$$y = V_{ref} \cdot a \cdot e^{(b \cdot x)}.$$

In this expression, 'x' represents a value of digital control signal 109 and 'y' represents a voltage at one of contact nodes 302 which may be selected to be an output of internal-reference DAC 104 (FIG. 1). In this expression, 'b' is a constant selected to determine the desired shape of the exponential curve defined by the above expression. In this expression 'a' is a constant and may be selected based on the following expression:

$$a = 1/(e^{(b \cdot N)}).$$

In this expression, N is based on the number of bits (n) comprising digital output signals 111 (FIG. 1) in accordance with the following expression:

$$N = 2^n - 1.$$

For an eight-bit ADC (n=8), N may equal 255, and for a seven-bit ADC (n=7), N may equal 127, although the scope of the invention is not limited in this respect.

In these embodiments, the value of each of the ladder-resistive elements 314 may be determined from the following expression:

$$R_L = b^2 \cdot R_G.$$

In some embodiments, the value of termination-resistive element 316 may be determined from the following expression:

$$R_T = b \cdot R_G \cdot (1 - 1.5b).$$

In these embodiments, the values of $R_T$ and $R_L$ may be determined based on a predetermined value of $R_G$. In some embodiments, 'b' may be selected based on the following expression:

$$1 = a \cdot e^{(b \cdot N)}.$$

In some embodiments, the value of ground-resistive elements 312 may be selected arbitrarily and/or based on the physical layout of resistive structure 300. In these embodiments, value of ground-resistive elements 312 may be independent of the value of termination-resistive element 316 and the value of the ladder-resistive elements 314.

In some embodiments, the number of contact nodes 302 may relate to a number of output bits comprising digital output signals 111 (FIG. 1). For example, the number of contact nodes 302 may equal two raised to the number of output bits (i.e., $2^n$). In some embodiments when successive-approximation ADC is an 8-bit ADC, resistive structure 110 (FIG. 1) may comprise 256 contact nodes 302 and switching element 112 (FIG. 1) may comprise 256 corresponding switches. In the example illustrated in FIG. 3B, eight contact nodes 302 are illustrated, which may correspond to at least a three-bit output. In some embodiments, a lower number of bits may actually be processed. For example, in some embodiments when successive-approximation ADC 100 (FIG. 1) is a 12-bit ADC, rather than 4096 contact nodes 302, resistive structure 110 (FIG. 1) may comprise 512 contact nodes. Three additional bits may be generated by known techniques or other circuitry (not illustrated).

In some eight-bit embodiments with 256 contact nodes, the value of 'a' may be about $4.689 \cdot 10^{-2}$, and the value of 'b' may be about $1.2 \cdot 10^{-2}$. With $V_{ref} = 1V$, the value of each ground-resistive element 312 may be selected to be about 5 kΩ, the value of each ladder-resistive element 314 may be about 0.72Ω based on the equations discussed above, and the value of termination-resistive element 316 may be about 73.3Ω based on the equations discussed above, although the scope of the invention is not limited in this respect.

In some embodiments, resistive structures 300 and 350 may be suitable for use in flash ADCs. In these embodiments, rather than a switching element, such as switching element 112 (FIG. 1), a comparator may be provided at each contact node 302. The comparators may compare a sampled input signal with the voltage present at the contact nodes. The outputs of the comparators may be used by control circuitry to generate a digital output signal. In these embodiments, 256 comparators may be used to generate an eight-bit digital output signal. In some embodiments, resistive structures 300 and 350 may be suitable for use in other types of ADCs that use 2″ switchable reference voltages, such as tracking ADCs, although the scope of the invention is not limited in this respect.

Figure 4:
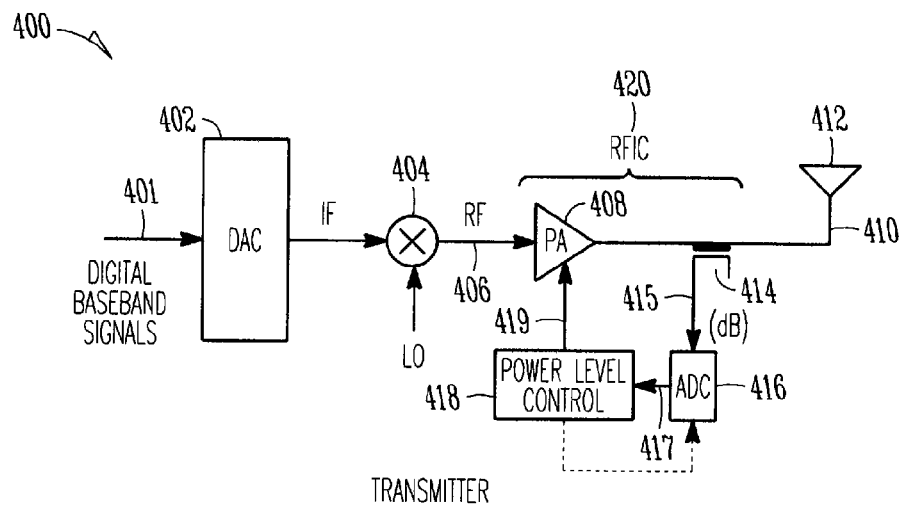
FIG. 4 is a block diagram of a transmitter in accordance with some embodiments of the present invention.

FIG. 4 is a block diagram of a transmitter in accordance with some embodiments of the present invention. Transmitter 400 may convert digital baseband signals 401 to analog intermediate frequency (IF) signals with digital-to-analog converter 402. Transmitter 400 may also convert the analog IF signals to RF signals 406 using one or more mixers 404.

Transmitter 400 may also include power amplifier 408 to amplify RF signals 406 to generate high power RF output signals 410 for transmission by antenna 412. Transmitter 400 may also include coupler 414 to couple high power RF output signals 410 and provide coupled output signals 415, and successive-approximation ADC 416 to convert an input voltage representing coupled output signals 415 to digital output signal 417. Transmitter 400 may also have power level control circuitry 418 responsive to digital output signal 417 to provide power level control signal 419 to control the power level of high-power RF output signals 410 of power amplifier 408.

In some embodiments, power level control circuitry 418 may compare digital output signal 417 with a digital representation of a desired signal level and may generate power level control signal 419 based on the difference, although the scope of the invention is not limited in this respect. In some of these embodiments, power level control signal 419 may be provided as feedback to successive-approximation ADC 416 for comparison with coupled output signals 415.

In some embodiments, power amplifier 408, coupler 414, successive-approximation ADC 416, and power level control circuitry 418 may be part of an integrated circuit, such as RF integrated circuit (RFIC) 420, although the scope of the invention is not limited in this respect. Other elements of transmitter 400 may also be included as part of RFIC 420.

In some embodiments, successive-approximation ADC 416 may have a logarithmic response. In these embodiments, successive-approximation ADC 100 (FIG. 1) may be suitable for use as successive-approximation ADC 416. In some embodiments, the voltage representing coupled output signals 415 may represent the dB level of high power RF output signals 410. In these embodiments, the non-linear (e.g., logarithmic) response of successive-approximation ADC 416 may provide increased sensitivity for lower power levels (e.g., region 202 of FIG. 2A) and reduced sensitivity for higher power levels (e.g., region 204 of FIG. 2A). Accordingly, more precise control may be achieved without the use of logarithmic-to-linear digital conversions.

In some embodiments, transmitter 400 may be part of a portable wireless communication device, such as a personal digital assistant (PDA), a laptop or portable computer with wireless communication capability, a web tablet, a wireless telephone, a wireless headset, a pager, an instant messaging device, a digital camera, an access point, a television, a medical device (e.g., a heart rate monitor, a blood pressure monitor, etc.), or other device that may receive and/or transmit information wirelessly.

In some embodiments, transmitter 400 may be part of a wireless communication device that communicates in accordance with one or more communication techniques and/or standards. In some embodiments, transmitter 400 may transmit signals in accordance with one of the Global System for Mobile Communications (GSM) standards. In some embodiments, transmitter 400 may transmit signals in accordance with a spread-spectrum technique, such as code division multiple access (CDMA). In some embodiments, transmitter 400 may transmit signals in accordance with a short-range wireless standard such as the Bluetooth® short-range digital communication protocol. In some embodiments, transmitter 400 may transmit signals in accordance with an ultra-wideband (UWB) communication technique where a carrier frequency is not used. In some embodiments, transmitter 400 may transmit signals in accordance with an optical communication technique, which may be in accordance with the Infrared Data Association (IrDA) standard.

In some embodiments, transmitter 400 may be a multicarrier transmitter that may transmit orthogonal frequency division multiplexed (OFDM) communication signals over a multicarrier communication channel. The OFDM signals may comprise a plurality of orthogonal subcarriers. In some of these multicarrier embodiments, transmitter 400 may be part of a wireless local area networks (WLANs) communication station, such as a wireless access point (AP), base station or mobile device including a Wireless Fidelity (WiFi) device. In some of these multicarrier embodiments, transmitter 400 may be part of a broadband wireless access (BWA) network communication station, such as a Worldwide Interoperability for Microwave Access (WiMax) communication station, although the scope of the invention is not limited in this respect as transmitter 400 may be part of almost any wireless communication device.

In some embodiments, transmitter 400 may communicate in accordance with specific communication standards, such as the Institute of Electrical and Electronics Engineers (IEEE) standards including IEEE 802.11(a), 802.11(b), 802.11(g), 802.11(h) and/or 802.11(n) standards and/or proposed specifications for WLANs, although the scope of the invention is not limited in this respect as they may also be suitable to transmit and/or receive communications in accordance with other techniques and standards. In some BWA network embodiments, transmitter 400 may communicate in accordance with the IEEE 802.16-2004 and the IEEE 802.16(e) standards for wireless metropolitan area networks (WMANs) including variations and evolutions thereof, although the scope of the invention is not limited in this respect as they may also be suitable to transmit and/or receive communications in accordance with other techniques and standards. For more information with respect to the IEEE 802.11 and IEEE 802.16 standards, please refer to "IEEE Standards for Information Technology—Telecommunications and Information Exchange between Systems"—Local Area Networks—Specific Requirements—Part 11 "Wireless LAN Medium Access Control (MAC) and Physical Layer (PHY), ISO/IEC 8802-11: 1999", and Metropolitan Area Networks—Specific Requirements—Part 16: "Air Interface for Fixed Broadband Wireless Access Systems," May 2005 and related amendments/versions.

Antenna 412 may comprise one or more directional or omnidirectional antennas, including, for example, dipole antennas, monopole antennas, patch antennas, loop antennas, microstrip antennas, or other types of antennas suitable for transmission of RF signals. In some embodiments, instead of two or more antennas, a single antenna with multiple apertures may be used. In these embodiments, each aperture may be considered a separate antenna.

Figure 5A:
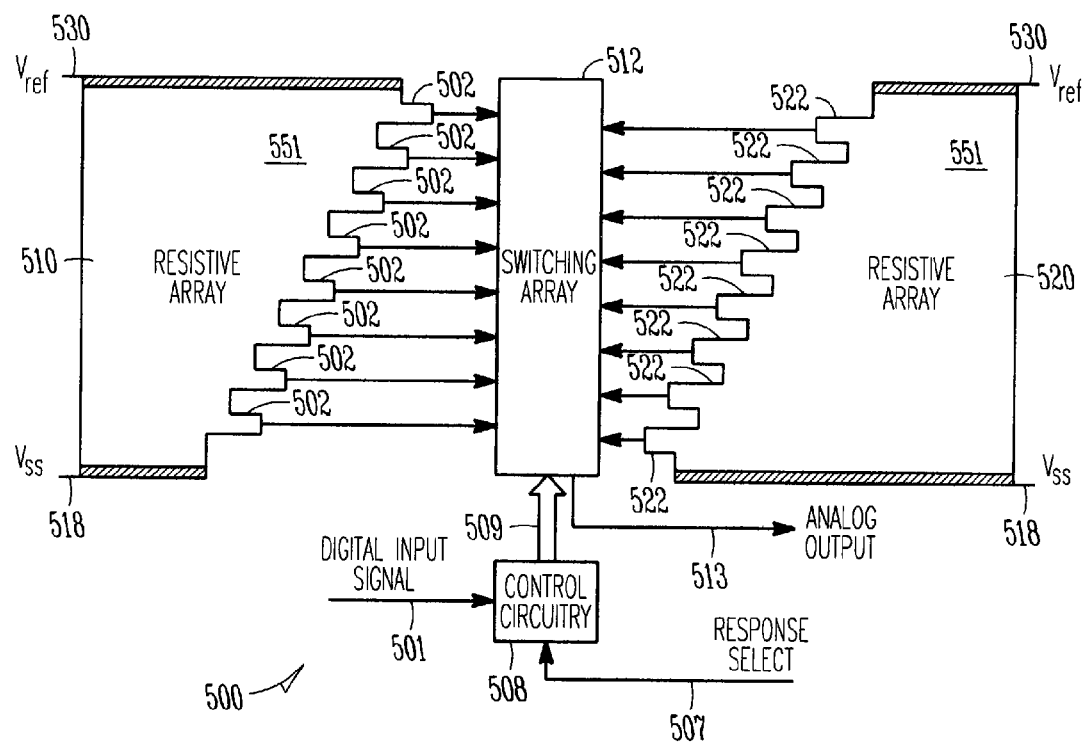
FIG. 5A is a block diagram of a DAC having a selectable response in accordance with some embodiments of the present invention.

FIG. 5A is a block diagram of a DAC having a selectable response in accordance with some embodiments of the present invention. DAC 500 may comprise resistive array 510 having a plurality of linearly-spaced contact nodes 502. Resistive array 510 may be coupled to stabilized reference voltage 530 ($V_{ref}$) and reference node 518 as shown. DAC 500 may also include switching array 512 to selectively couple one of the contact nodes 502 with analog output 513 based on control signal 509. DAC 500 may also include control circuitry 508 to generate control signal 509 based on digital input signal 501. In some embodiments, resistive array 510 may be a wedge-shaped resistive array and each of contact nodes 502 may provide corresponding reference voltages that vary logarithmically with respect to contact nodes 502. In these embodiments, analog output 513 may vary logarithmically with respect to digital input signal 501.

In some embodiments, resistive array 510 may comprise polycrystalline silicon 551 disposed on a semiconductor substrate. In these embodiments, linearly-spaced contact nodes 502 may be provided along an angled edge of resistive array 510 as illustrated.

In some embodiments, DAC 500 may provide either a logarithmic response or a linear response based on response select signal 507. In these embodiments, DAC 500 may also include resistive array 520 with linearly-spaced contact nodes 522 coupled to switching array 512. In these embodiments, switching array 512 may couple each contact node 502 of the resistive array 510 to a corresponding contact node 522 of resistive array 520 when a linear response is selected. Switching array 512 may open the connection between each contact node 502 of resistive array 510 and corresponding contact node 522 of resistive array 520 when a logarithmic response is selected. In some embodiments, resistive array 520 may be a wedge-shaped resistive array and each of contact nodes 522 may provide corresponding reference voltages that vary logarithmically with respect to contact nodes 522. Resistive array 520 may be coupled to stabilized reference voltage 530 ($V_{ref}$) and reference node 518 as shown.

The selective coupling of contact nodes 522 of resistive array 520 to corresponding contact nodes 502 of resistive array 510 may allow DAC 500 to switch from providing a logarithmic response to a linear response. As illustrated in FIG. 5A, resistive array 520 may be a rotated version of resistive array 510 (i.e., rotated 180 degrees), although the scope of the invention is not limited in this respect. In accordance with these embodiments, based on response select signal 507, control circuitry 508 may instruct switching array 512 to either couple each contact node 502 of resistive array 510 to the corresponding contact node 522 of resistive array 520, or to open the connection between each contact node 502 and the corresponding contact node 522.

In some embodiments, the corresponding reference voltages at contact nodes 502 may vary inversely to the corresponding reference voltages at the contact nodes 522. In this way, when corresponding contact nodes are coupled, a linear response may be provided.

In some embodiments, control signal 509 may comprise a binary code based on digital input signal 501 that causes switching array 512 to couple one of the contact nodes 502 to analog output 513. In these embodiments, DAC 500 may achieve a logarithmic response, when selected, without having the contact nodes positioned logarithmically. A logarithmic response may be achieved by the linear spacing of contact nodes 502 along the angled edge of resistive array 510.

In some embodiments, when DAC 500 is configured to provide a logarithmic response, it may be suitable for volume control in audio systems and or hearing aids, although the scope of the invention is not limited in this respect.

Figure 5B:
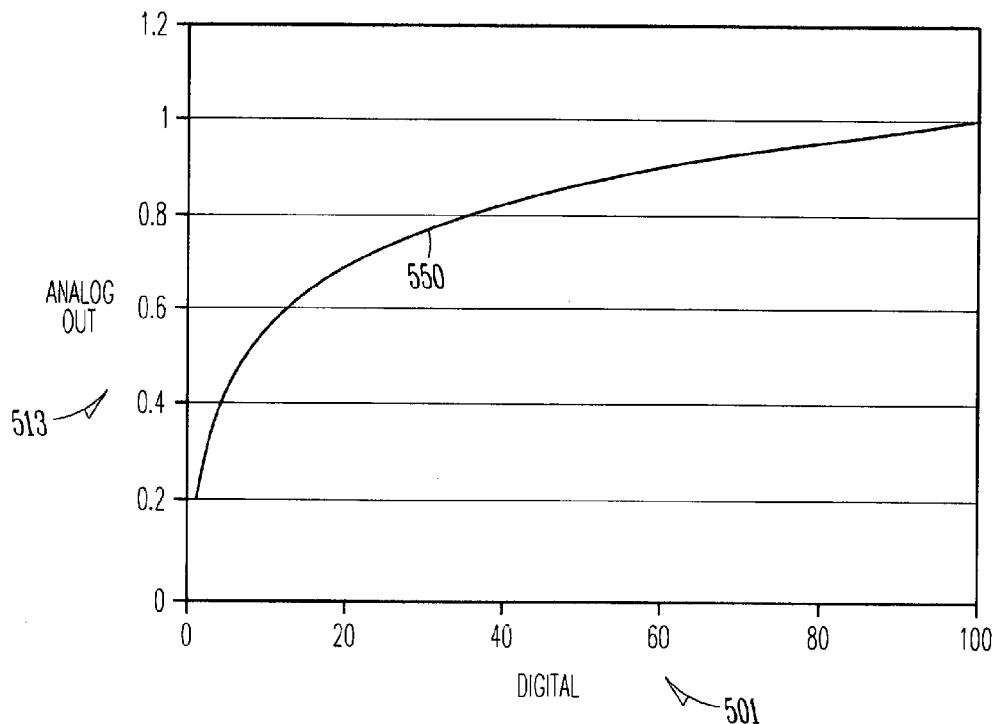
FIG. 5B illustrates a logarithmic response of a DAC in accordance with some embodiments of the present invention.

FIG. 5B illustrates a logarithmic response of a DAC in accordance with some embodiments of the present invention. Logarithmic response 550 may correspond to the response of DAC 500 (FIG. 5A) when a logarithmic response is selected. In these embodiments, analog output 513 may be a logarithmic function based on digital input signal 501.

Figure 6:
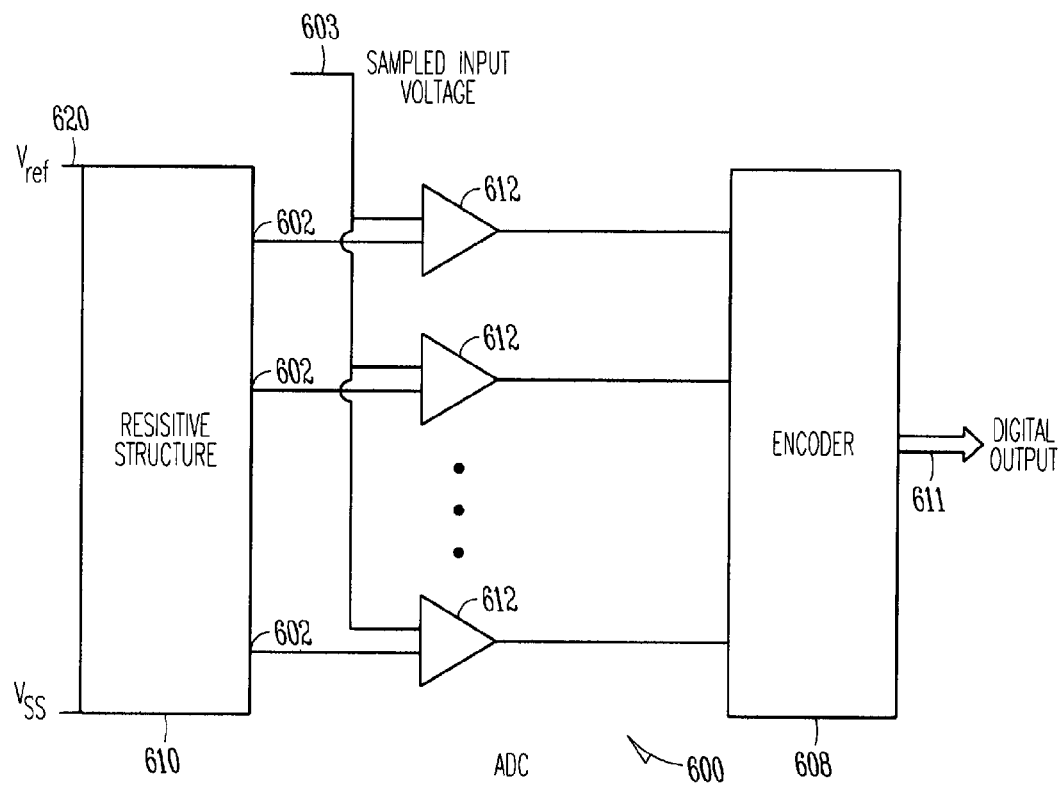
FIG. 6 is a block diagram of an ADC in accordance with some embodiments of the present invention.

FIG. 6 is a block diagram of an ADC in accordance with some embodiments of the present invention. ADC 600 comprises resistive structure 610 having a plurality of linearly-spaced contact nodes 602 to provide corresponding reference voltages that vary exponentially. ADC 600 may also comprise a plurality of comparators 612 to compare outputs of the contact nodes 602 and sampled input voltage 603. ADC 600 may also comprise encoder circuitry 608 to generate digital output signals 611 based on outputs of comparators 612. In some embodiments, ADC 600 may be a flash ADC that provides a logarithmic response. In some embodiments, encoder circuitry 608 may comprise a priority encoder, although the scope of the invention is not limited in this respect.

In some embodiments, resistive structure 610 may be coupled to stabilized reference voltage 620 to provide the corresponding reference voltages at contact nodes 602. In some embodiments, the elements of resistive structure 610 may be selected to provide the corresponding reference voltages at contact nodes 602 with an exponential profile. In these embodiments, digital output signals 611 may vary logarithmically with respect to the sampled input voltage 603. In some embodiments, either resistive structure 300 (FIG. 3A) or resistive structure 350 (FIG. 3B) may be suitable for use as resistive structure 610.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

The invention claimed is:

1. A method for controlling output power comprising:
converting an input voltage representing an RF output signal level to a digital output signal with an analog-to-digital converter (ADC) having a non-linear response; and
providing a power level control signal to control the RF output signal level in response to the digital output signal,
wherein the converting comprises:
providing corresponding reference voltages that vary exponentially with a resistive structure having a plurality of linearly-spaced contact nodes; and
generating the digital output signal based on a comparison between on an output of a selected one of the contact nodes and a sampled input voltage.

2. The method of claim 1 wherein generating the digital output signal comprises:
selectively coupling one of the contact nodes to an analog output based on a digital control signal;
comparing the analog output with the sampled input voltage; and
adjusting the digital control signal based on the comparing until a voltage level of the analog output approximates the sampled input voltage.

3. The method of claim 1 wherein providing the corresponding reference voltages comprises coupling the resistive structure to a stabilized reference voltage to provide the corresponding reference voltages at the contact nodes,
wherein elements of the resistive structure are selected to provide the corresponding reference voltages at the contact nodes with an exponential profile, and
wherein the digital output signal varies logarithmically with respect to the sampled input voltage.

4. The method of claim 3 wherein the resistive structure comprises:
- a plurality of ladder-resistive elements ($R_L$) arranged in series, each of the ladder-resistive elements provided between two of the contact nodes;
- a plurality of ground-resistive elements ($R_G$), each ground-resistive element to couple one contact node to a reference node; and
- a termination-resistive element ($R_T$) coupling a final ladder-resistive element to the reference node,
- wherein the stabilized reference voltage is provided across the reference node and an initial one of the contact nodes.

5. The method of claim 4 wherein a value of each of the ladder-resistive elements is determined from the following expression based on a predetermined value of the ground-resistive elements $R_G$:

$$R_L = b^2 \cdot R_G,$$

wherein a value of the termination-resistive element ($R_T$) is determined from the following expression based on the predetermined value of the ground-resistive elements $R_G$:

$$R_T = b \cdot R_G \cdot (1 - 1.5b),$$

and wherein 'b' is a constant selected based on a number of bits (n) comprising the digital output signal.

6. The method of claim 4 wherein the ladder-resistive elements, the ground-resistive elements, and the termination-resistive element comprise a polycrystalline silicon material disposed on a semiconductor substrate.

7. The method of claim 3 wherein the resistive structure comprises a resistive semiconductor material disposed on a semiconductor substrate in a comb-like configuration,
- wherein the contact nodes are provided with a substantially constant spacing therebetween along a first strip of the resistive semiconductor material to define the plurality of ladder-resistive elements,
- wherein the ground-resistive elements comprise second strips of the resistive semiconductor material coupling the first strip to the reference node, the second strips being regularly spaced and parallel to each other, and
- wherein the termination-resistive element comprises a third strip of the resistive semiconductor material to couple the first strip to the reference node.

* * * * *